(12) United States Patent
Towers et al.

(10) Patent No.: US 10,012,684 B2
(45) Date of Patent: Jul. 3, 2018

(54) GROUND FAULT DETECTION CIRCUIT

(71) Applicant: Control Techniques Limited, Newtown (GB)

(72) Inventors: Mark Towers, Newtown (GB); Dylan Wyn Davies, Oswestry (GB)

(73) Assignee: NIDEC CONTROL TECHNIQUES LIMITED, Newtown (GB)

( * ) Notice: Subject to any disclaimer, the term of this patent is extended or adjusted under 35 U.S.C. 154(b) by 0 days.

(21) Appl. No.: 15/383,828

(22) Filed: Dec. 19, 2016

(65) Prior Publication Data
US 2017/0097385 A1   Apr. 6, 2017

Related U.S. Application Data

(63) Continuation of application No. 14/186,543, filed on Feb. 21, 2014, now Pat. No. 9,541,593.

(30) Foreign Application Priority Data

Feb. 22, 2013  (GB) .................................. 1303207.3
May 21, 2013  (GB) .................................. 1309114.5

(51) Int. Cl.
| | |
|---|---|
| *G01R 31/14* | (2006.01) |
| *G01R 31/02* | (2006.01) |
| *G01R 27/18* | (2006.01) |
| *G01R 31/07* | (2006.01) |
| *H02S 50/10* | (2014.01) |
| *H02S 40/32* | (2014.01) |

(52) U.S. Cl.
CPC ........... *G01R 31/025* (2013.01); *G01R 27/18* (2013.01); *G01R 31/024* (2013.01); *G01R 31/07* (2013.01); *H02S 50/10* (2014.12); *H02S 40/32* (2014.12)

(58) Field of Classification Search
CPC ...... G01R 31/025; G01R 31/07; G01R 27/18; G01R 31/024; G01R 31/021; G01R 31/12; G01R 31/1272; H02S 50/10
USPC ................ 324/500, 508, 509, 541, 544, 551
See application file for complete search history.

(56) References Cited

U.S. PATENT DOCUMENTS

| | | | |
|---|---|---|---|
| 5,563,811 A | 10/1996 | Embree | |
| 6,101,073 A | 8/2000 | Takehara | |
| 8,564,916 B2 | 10/2013 | Kazemi et al. | |
| 2003/0081360 A1* | 5/2003 | Holley | H02H 1/06 |
| | | | 361/42 |
| 2005/0047035 A1 | 3/2005 | Vallinmaki et al. | |
| 2005/0180069 A1* | 8/2005 | Tchernobrivets | H02H 3/162 |
| | | | 361/46 |

(Continued)

FOREIGN PATENT DOCUMENTS

| | | |
|---|---|---|
| CN | 202002997 U | 10/2011 |
| DE | 2830417 A1 | 1/1980 |
| GB | 1572455 A | 7/1980 |

*Primary Examiner* — Huy Q Phan
*Assistant Examiner* — Raul Rios Russo
(74) *Attorney, Agent, or Firm* — Harness, Dickey & Pierce, P.L.C.

(57) ABSTRACT

A ground fault detection circuit comprising a fuse and a fuse detect circuit. The fuse and the fuse detect circuit are arranged to be coupled in parallel between a reference point and a second point of a monitored circuit for which ground faults are to be detected. The fuse detect circuit is further arranged to detect a fuse break indicative of a ground fault condition and disable at least a portion of the monitored circuit.

16 Claims, 5 Drawing Sheets

(56) References Cited

U.S. PATENT DOCUMENTS

| | | |
|---|---|---|
| 2006/0227472 A1 | 10/2006 | Taylor et al. |
| 2007/0057678 A1 | 3/2007 | Dvorak et al. |
| 2011/0014501 A1 | 1/2011 | Scheucher |
| 2011/0216452 A1* | 9/2011 | Haines .................... H02H 3/00 361/42 |
| 2011/0222194 A1 | 9/2011 | Kinsel et al. |
| 2012/0154972 A1* | 6/2012 | McMahon ............. H01H 47/22 361/187 |
| 2012/0194200 A1 | 8/2012 | McDiarmid et al. |
| 2012/0217970 A1* | 8/2012 | Macbeth ................ G01R 31/14 324/424 |

* cited by examiner

GROUND FAULT DETECTION CIRCUIT

CROSS-REFERENCE TO RELATED APPLICATIONS

This application is a continuation of U.S. application Ser. No. 14/186,543 filed Feb. 21, 2014, which claims the benefit and priority of Great Britain Patent Application No. 1303207.3 filed Feb. 22, 2013 and Great Britain Patent Application No. 1309114.5 filed May 21, 2013. The entire disclosures of each of the above applications are incorporated herein by reference.

FIELD

This invention relates to a ground fault detection circuit. It is particularly suitable for, but by no means limited to use with an inverter, for example an inverter associated with a grounded PV (photovoltaic) array.

BACKGROUND

In photovoltaic power systems, it may be necessary to ground one power terminal of a photovoltaic array to comply with regulations, for example UL 1741 or to comply with manufacturers recommendations (some thin-film modules). These systems may either be positively grounded or negatively grounded at a single point.

During the operation of grounded PV systems it is possible for a fault to develop which acts as a second grounding point for the array. Depending on the location of this fault, large ground currents may flow. This is a potentially dangerous situation therefore the ground fault current must be interrupted. Interruption of the fault current is typically achieved by disconnecting the original grounding point. A ground fault indication is made and the inverter associated with the PV system is disabled at this time so that the ground fault can be rectified as soon as possible. The grounding of the array, interruption of fault current, and indication that a ground fault has occurred (the indication of which is used to disable the inverter and alert a user) are achieved by a Ground Fault Detection and Interrupt circuit (GFDI).

Components of such systems must undergo rigorous testing before being approved for use. In the US the Underwriters laboratory standard UL1741 'Inverters, Converters, Controllers and Interconnection System Equipment for Use With Distributed Energy Resources' is required by the inverters of most photovoltaic installations. Typically, such systems are tolerant only of DC voltages up to 600V however there is a demand for 1000V listed products. To simplify the approvals process it is desirable that components listed by US national test laboratories are used. However due to other US standards (e.g. UL508A) such components are typically listed for DC voltages of a maximum of 600V.

Accordingly, there is a need for a UL1741 compliant, high voltage tolerant GFDI system. To minimise the testing required for such a system it is desirable that it is constructed using components listed by US national test laboratories.

SUMMARY

According to a first aspect there is provided a ground fault detection circuit as defined in claim 1 of the appended claims. Thus there is provided a ground fault detection circuit comprising a fuse, a fuse detect circuit, the fuse and the fuse detect circuit being arranged to be coupled in parallel between a reference point and a second point of a monitored circuit for which ground faults are to be detected and wherein the fuse detect circuit is further arranged to detect a fuse break indicative of a ground fault condition and disable at least a portion of the monitored circuit.

Optionally, a fuse break indicative of a ground fault is detectable by detecting at least a pre-determined voltage across the fuse or a signal indicative of current passing through the fuse Optionally, the pre-determined voltage across the fuse is caused by the breaking of the fuse due to at least a pre-determined current flowing therethrough.

Optionally, the fuse detect circuit comprises a voltage monitor arranged to be coupled in parallel between the reference point and the second point of a monitored circuit for which ground faults are to be detected.

Optionally, the fuse detect circuit comprises at least two voltage monitors.

Optionally, the fuse detect circuit further comprises a potential divider coupled between each voltage monitor and the fuse.

Optionally, the potential divider comprises resistors of a value between 100 k ohms and 100 M ohms.

Optionally, the fuse is rated between 1 A and 5 A.

Optionally, each voltage monitor is a voltage monitoring relay.

Optionally, the fuse detect circuit comprises an isolated direct current (DC) or alternating current (AC) source arranged to inject a current into the fuse.

Optionally, the fuse detect circuit further comprises detection means arranged to detect the current that was injected into the fuse and that has passed through the fuse or a signal indicative thereof.

Optionally, the detection means of the fuse detect circuit is arranged to detect a current signal waveform.

Optionally, the detection means comprises a filter.

Optionally, the fuse detect circuit is further arranged to indicate a fault condition on an output.

Optionally, the second point of the monitored circuit is a positive connection.

Optionally, the second point of the monitored circuit is a negative connection.

Optionally, the circuit is tolerant to voltages of 600V or more.

Optionally, the circuit is tolerant to voltages of 1000V or more.

Optionally, the reference point is a ground connection.

Optionally, the second point is a DC connection.

Optionally, the second point is an AC connection.

According to a second aspect there is provided a method of detecting a ground fault as defined in claim 14. There is provided a method comprising detecting by a fuse detect circuit a fuse break indicative of a ground fault condition, the fuse and the fuse detect circuit arranged to be coupled in parallel between a reference point and a second point of a monitored circuit, and disabling at least a portion of the monitored circuit in response to detecting the fuse break condition.

Optionally, detecting a fuse break indicative of a ground fault comprises detecting at least a pre-determined voltage across the fuse or a signal indicative of current passing through the fuse.

Optionally, the pre-determined voltage across the fuse is caused by the breaking of the fuse due to at least a pre-determined current flowing therethrough.

Optionally, the fuse detect circuit comprises an isolated DC or AC source arranged to inject a current into the fuse.

Optionally, the fuse detect circuit further comprises detection means arranged to detect the current that was injected into the fuse and that has passed through the fuse or a signal indicative thereof.

Optionally, the detection means of the fuse detect circuit is arranged to detect a current signal waveform.

Optionally, the detection means comprises a filter.

Optionally, the fuse detect circuit is further arranged to indicate a fault condition on an output.

According to a third aspect there is provided a ground fault detection system. The system comprising a ground fault detect circuit wherein a PV array is the monitored circuit and an inverter of the PV array is arranged to be disabled in response to detecting the fuse break indicative of a ground fault condition.

With all the aspects, optional features are defined in the dependent claims.

Where electron current flow is referred to herein, it is to be understood that this is in the opposite direction to conventional current theory as the skilled person would understand.

BRIEF DESCRIPTION OF THE DRAWINGS

Embodiments will now be described, by way of example only, and with reference to the drawings in which.

In the figures, like elements are indicated by like reference numerals throughout.

DETAILED DESCRIPTION

Figure 1:
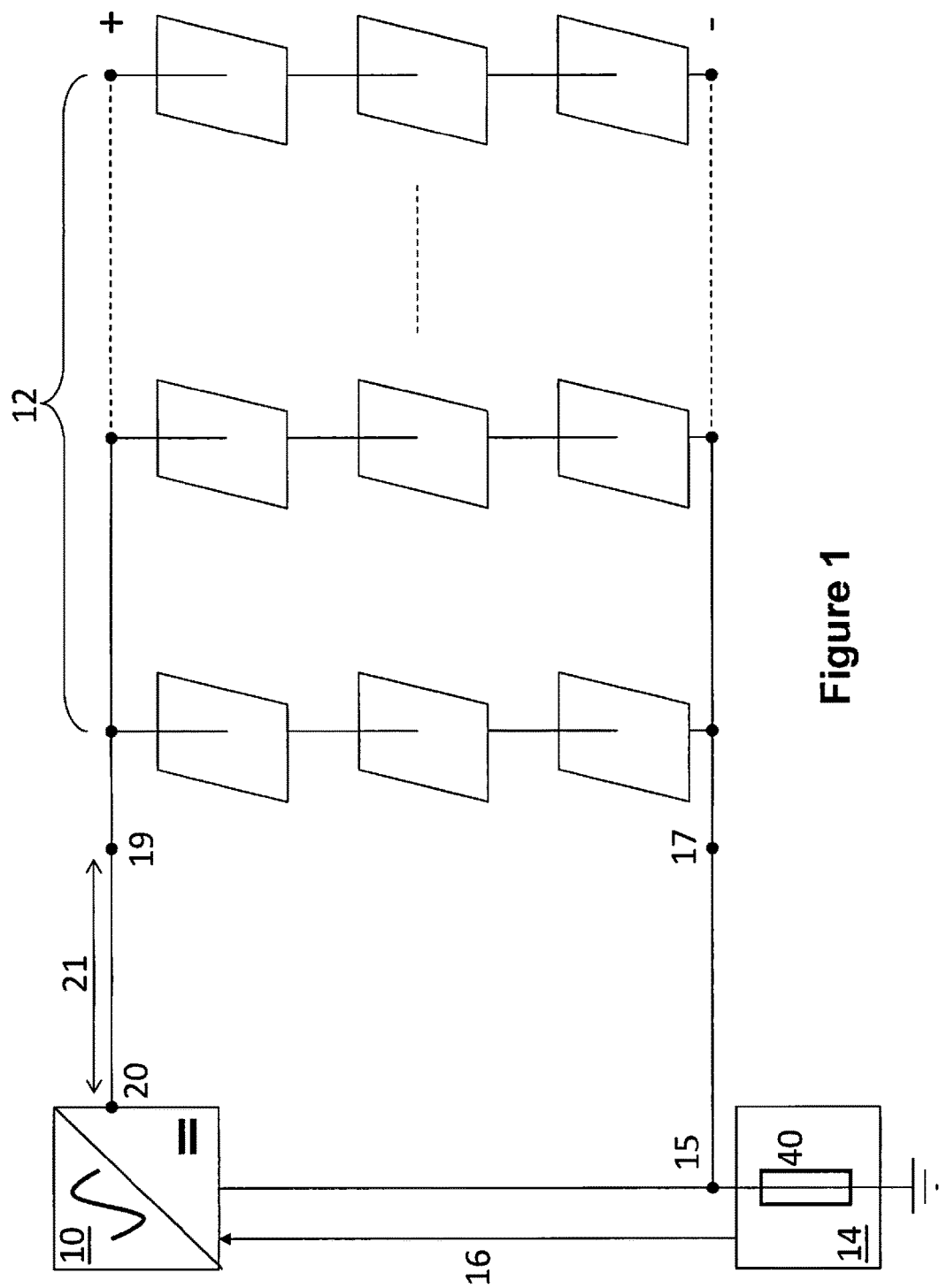
FIG. 1 illustrates a ground fault detection system according to an embodiment.

In overview, and as illustrated in FIG. 1, a ground fault detect system comprises a ground fault detect and interrupt (GFDI) circuit 14 positioned in relation to a monitored circuit. For example, in FIG. 1, the monitored circuit comprises a photovoltaic cell (PV) array 12 coupled to an inverter 10 by way of negative terminal 17 and positive terminal 19 for converting the DC voltage produced by the PV array to an AC voltage as would be understood by the skilled person.

A ground current may begin to flow due to a fault such as the break down in a PV module of the array which allows current flow from the module to its grounded casing. Other causes of ground current flow could be the severing of a cable by a maintenance worker, or the site where the PV array is situated becoming flooded.

The GFDI circuit 14 is arranged to detect the breaking of a fuse 40 which is indicative of ground current flow. The breaking of the fuse may be determined by detecting whether the voltage across the fuse exceeds a pre-determined threshold. The breaking of the fuse may also be detected by injecting a current into the fuse and monitoring for the injected current or a signal indicative thereof. If the current detected is below a pre-determined threshold, the fuse is considered to be broken due to ground current flow. The current injected may be a signal waveform which is detectable, for example by way of a filter.

In response to detecting the breaking of the fuse, the GFDI circuit 14 is arranged to disable the monitored circuit and/or the inverter by way of output 16. This may be achieved by opening a relay connected to an input of the inverter (not shown). For example, a monitoring relay may monitor the voltage across the fuse and open or close its output relays in response to the monitored voltage. In a current detection embodiment, a current monitoring relay may operate in the same way. This relay may be is placed in the E-stop chain of the SPV system.

In FIG. 1, the pv array is shown as being negatively grounded with the GFDI circuit 14 being positioned between a negative ground connection and the negative terminal 17. The pv array could alternatively be positively grounded with the GFDI circuit 14 being positioned between a positive ground connection and the positive terminal 19.

Figure 2:
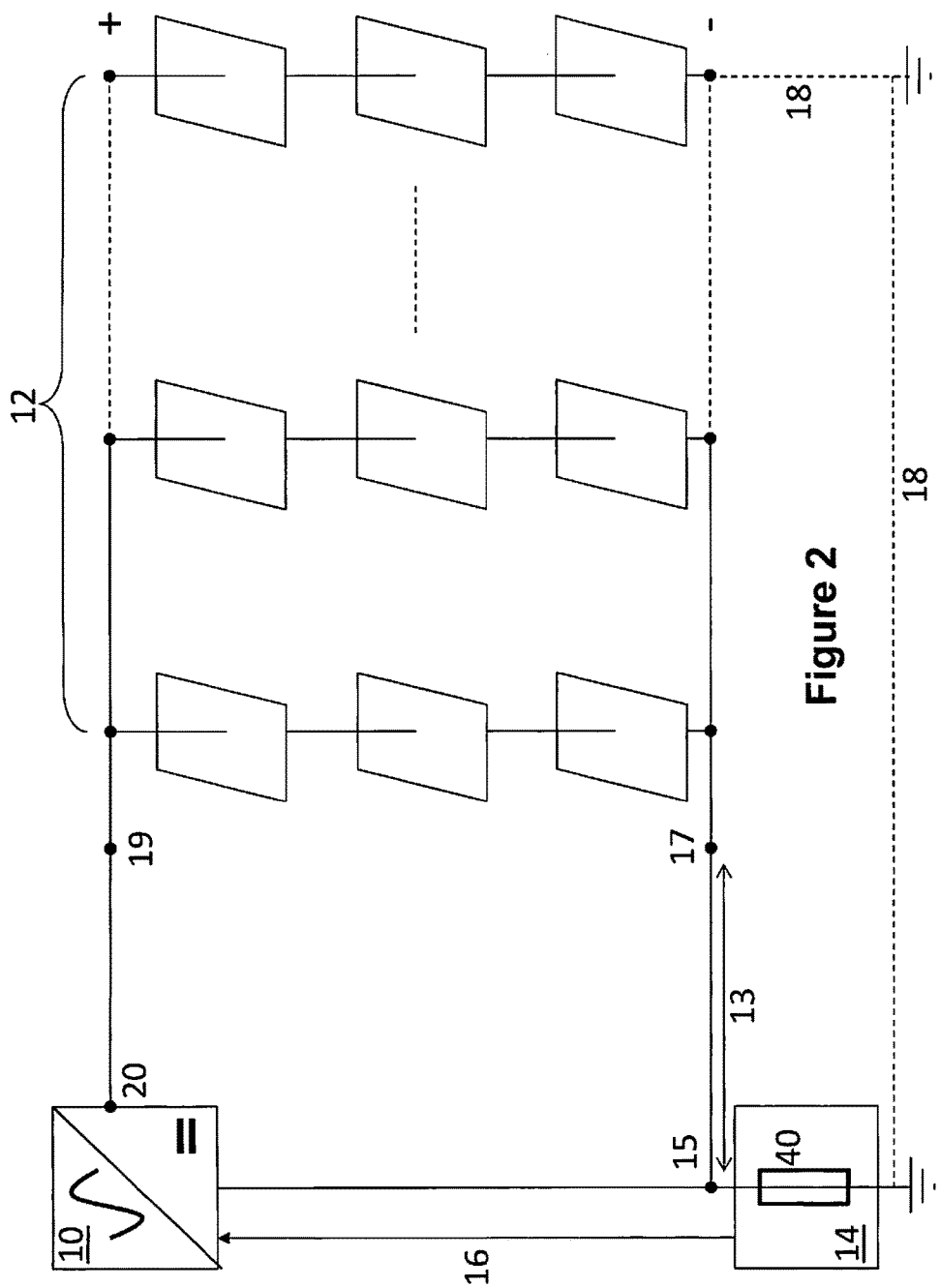
FIG. 2 illustrates a negative ground fault.

FIG. 2 illustrates a negative ground fault that is detectable by the GFDI circuit 14. Under normal operation the (electron) current flowing into the array via the negative terminal 17 causes a voltage drop in the cable 13 connecting the array to the inverter at point 15 so that there is a positive potential difference between points 17 and 15. During a negative ground fault shown as path 18 in FIG. 2, (electron) current flow will be shared between the cable and the ground fault path as two resistances in parallel (as would be understood by the skilled person). The fuse will break if the ground path is of sufficiently low impedance so that the current flowing through the fuse exceeds the fuse rating. The breaking of the fuse results in the disconnection of the normally grounded point 15 from ground. The voltage drop in the cable 13 is then placed across the broken fuse which can be detected by GFDI circuit 14, and an indication can be provided to signify that a ground fault has occurred.

Figure 3:
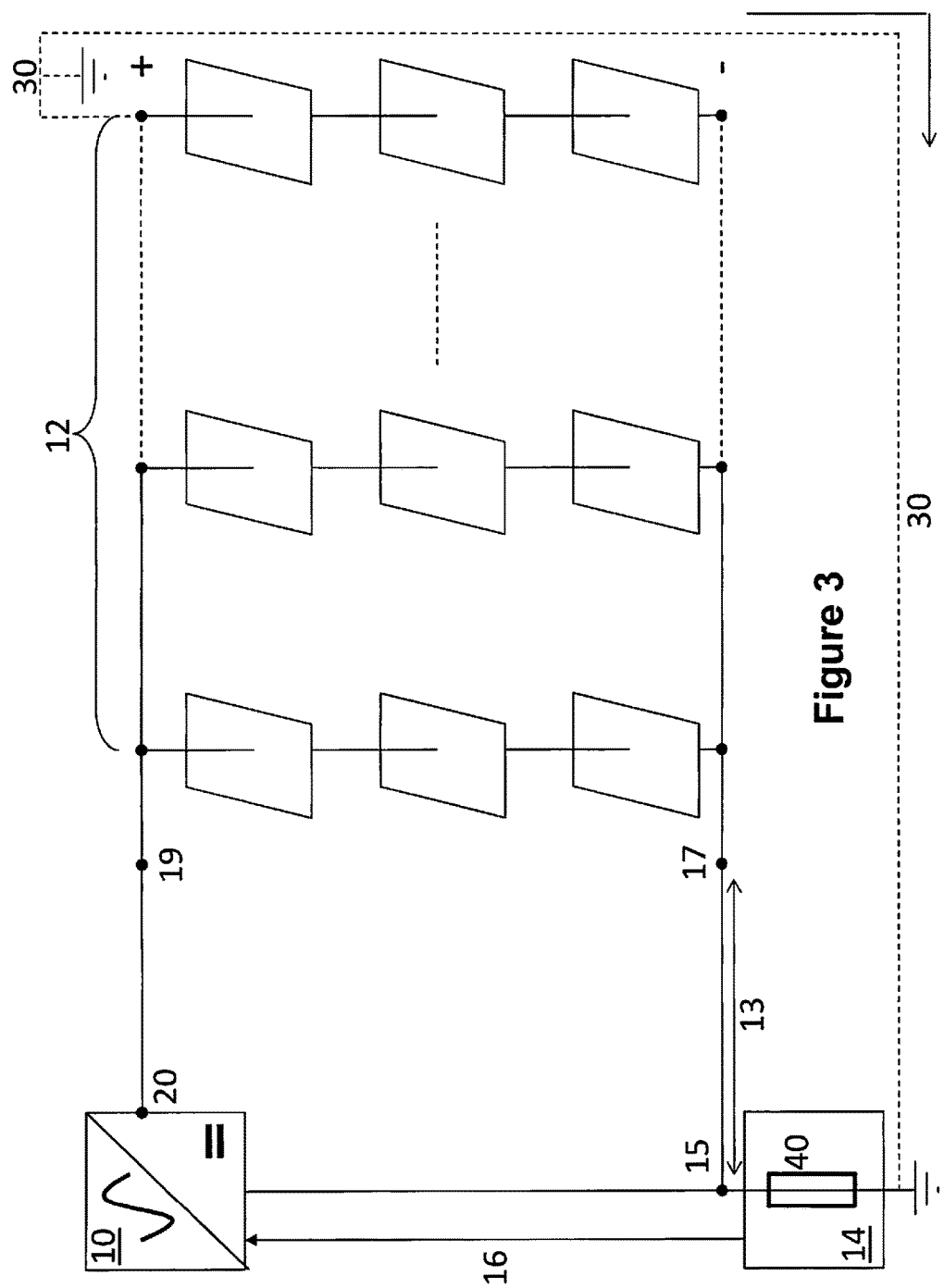
FIG. 3 illustrates a positive ground fault.

FIG. 3 illustrates a positive ground fault that is detectable by the GFDI circuit 14. Current flows through the ground fault path 30 (and hence through the fuse 40) due to the potential across the PV array (in this embodiment between points 19 and 17). If the positive ground fault occurred at an intermediate module of the array, the array potential at the point of the fault would be less than the potential between points 19 and 17. The fuse may break in the same manner as that described for a negative ground fault in relation to FIG. 2.

Figure 4:
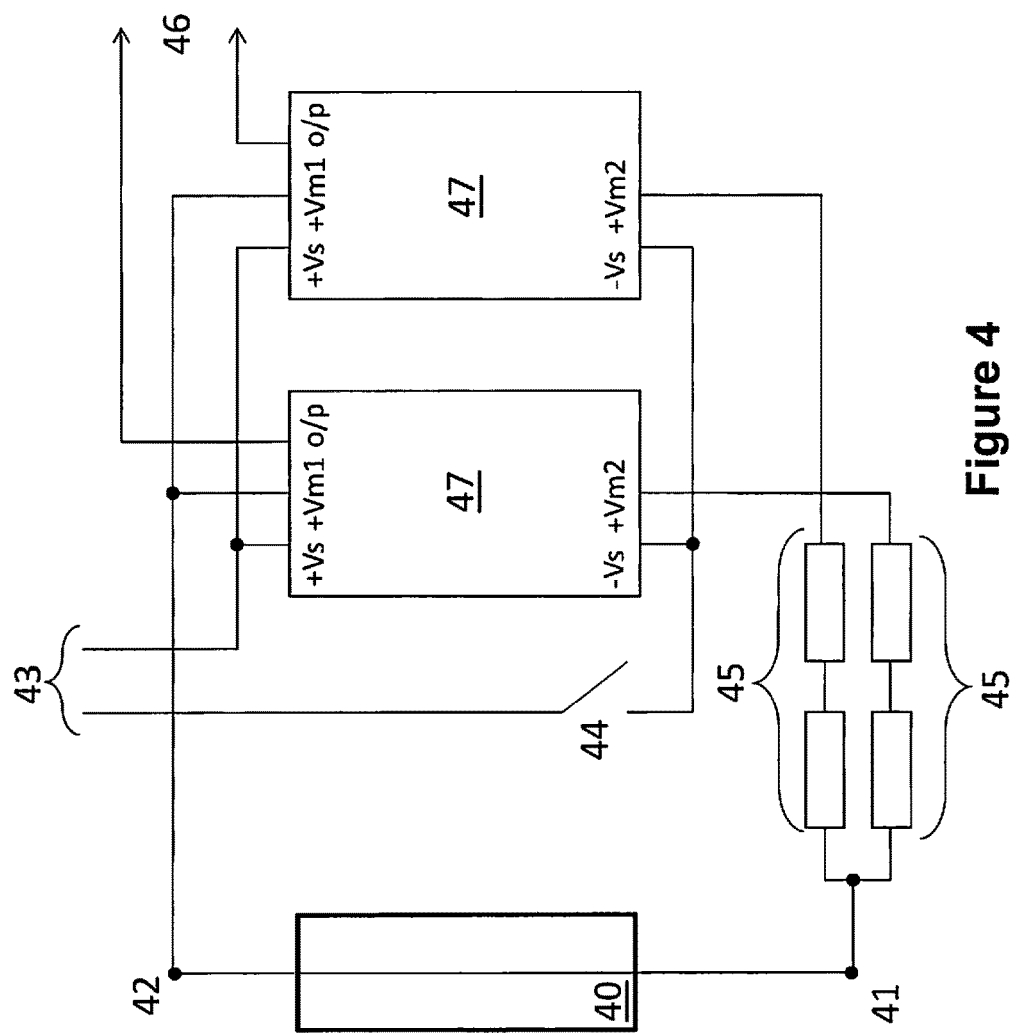
FIG. 4 illustrates a GFDI circuit according to an embodiment.

Turning to FIG. 4, a GFDI circuit 14 according to an embodiment is illustrated. Fuse 40 is coupled between a ground connection 41 and a dc connection 42 (equivalent to point 15 of FIGS. 1-3) of a circuit to be monitored for ground faults. To comply with UL1741, fuse 40 may be rated between 1 A and 5 A, and optionally, may comprise a fuse holder. A voltage monitor 47, which may comprise a voltage monitoring relay, is connected in parallel with the fuse and arranged to monitor the voltage across the fuse on inputs Vm1 and Vm2. A plurality of voltage monitors may be used for redundancy and safety. The voltage monitors may also be connected in a fail-safe arrangement. The fail safe arrangement may comprise two independently controlled voltage monitors, with outputs series connected and configured to provide a positive 'healthy' indication on respective outputs 46, for example by opening normally closed contacts or closing normally open contacts. With a series connection of outputs 46, any single component (except for connections 41 and 42 of FIG. 4) may fail without a false healthy indication being given. Each voltage monitor is provided with a power supply 43 (+Vs, −Vs), for example a 24v power supply. Voltage monitor(s) 47 may be disabled by optional switch 44.

A potential divider 45 may be provided for each voltage monitor 47 to protect the inputs of each monitor against excessive voltage. This can be used to employ voltage monitors of a voltage tolerance that is less than the operating conditions of the circuit to be monitored. The resistors of the potential divider may be of values in the range of 100 k ohms to 100 M ohms and may be chosen based on reducing power dissipation, and/or minimising the attenuation of the signal to maximise resolution.

Each voltage monitor comprises an output 46 on which an indication of a ground fault condition may be made. This may comprise illuminating a lamp or other indication means. To comply with UL1741 output 46 should also cause the inverter to stop which may be by way of output 16 from FIGS. 1 to 3. In an embodiment comprising more than one voltage monitor, outputs 46 may be connected in series.

As discussed in relation to FIGS. 1 to 3, when a ground fault occurs, ground fault current flows through the fuse 40. While the fuse remains intact, the voltage across the fuse is a low voltage, for example less than 1 volt (subject to the resistance of the fuse as would be understood by the skilled person). In this event, a voltage monitor 47 would detect only a small voltage across the fuse between inputs Vm1 and Vm2 which is not considered to be large enough to be indicative of a ground fault. As the ground fault current rises, the fuse will eventually break at its rated current level. Subsequent to the fuse breaking, voltage monitor 47 detects an increase in the voltage across the fuse between inputs Vm1 and Vm2 due to the potential of the PV array or the aforementioned voltage drop in the grounding cable 13. This increase in voltage is determined by the voltage monitor to indicate a fuse break condition, which, in turn, is indicative of a ground fault current. The ground fault condition may be indicated on output 46 to warn personnel that there may be 'normally grounded' points of the array 12 that are no longer at ground potential i.e. they may be 'live' and pose a danger. Preferably, output 46 should disable the inverter. In addition to warning the personnel of the hazard, output 46 also reminds personnel to rectify the fault.

Voltage monitor 47 is arranged to indicate a ground fault condition subsequent to at least a pre-determined voltage level being detected across inputs Vm1 and Vm2 The pre-determined voltage level may be set at a value only attainable when the fuse has broken.

Preferably, components of GFDI circuit 14 are chosen so that the voltage monitor can detect a voltage across the fuse at, for example less than 20V to reduce the hazard to personnel. This could be achieved by selecting a high precision voltage monitor with a high input impedance (between Vm1 & Vm2) to reduce attenuation of the input voltage that the voltage monitor is able to detect.

Figure 5:
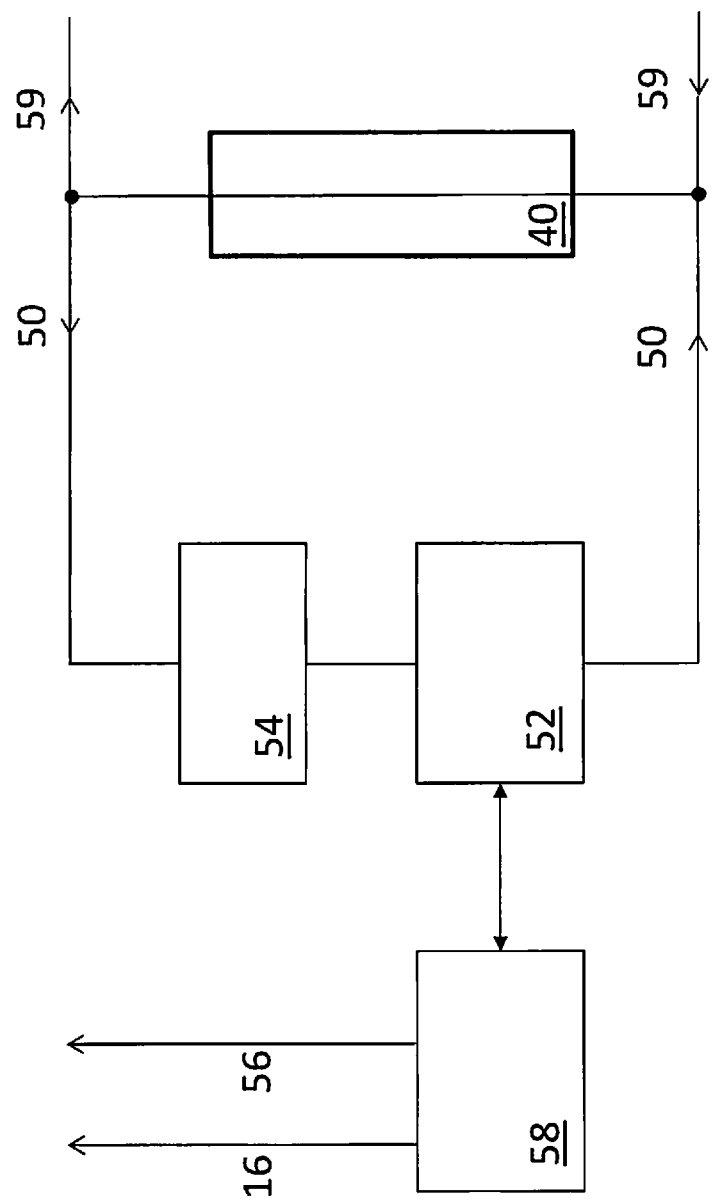
FIG. 5 illustrates a GFDI circuit according to an embodiment.

FIG. 5 shows an alternative embodiment of GFDI circuit 14. In this embodiment an isolated DC or AC source 52 is used to inject a small sensing current 50 into fuse 40. Fuse 40 is positioned in a similar manner to FIGS. 1 to 4 in relation to the circuit to be monitored. The sensing current is of a level to prevent a significant alteration to the current at which the fuse will break for example preferably no more than 100 mA, or alternatively the sending current can be take into account when choosing a fuse. The current passing through fuse 40 is therefore equal to any ground fault current 59 plus the injected current 50 (or minus the injected current if DC current and in the opposite direction). The state of the fuse may be determined by measuring the current at inline current measurer 54. If the current measured is above a pre-determined threshold this is interpreted as indicating that the fuse is unbroken and no ground fault has occurred. If the current is less than a pre-determined threshold then the fuse is considered to have broken, and a ground fault condition is indicated on output 56, for example, by way of illuminating a lamp or other means. The circuit being monitored may also be disabled by way of output 16, in the same manner as the embodiment of FIGS. 1 to 4.

In the embodiments of FIGS. 1 to 5 where a PV array and associated inverter are monitored, the inverter may be disabled. The same effect could also be achieved by measuring the input current to the source (at 58) with additional compensation for the losses present in the isolated power supply 52. One benefit of this would be that the measuring circuit would be protected due to the isolation in the PSU.

A further embodiment could comprise the detection of a current flowing inside the power supply which may comprise using existing components used for controlling a switch-mode power supply. The monitoring could be achieved electrically, for example by monitoring an existing component in the switch-mode power supply) or in software, for example by monitoring a variable in a microprocessor that is arranged to control the switch-mode power supply.

The average current injected into the fuse may be reduced (to minimise the impact on the fuse being monitored and to reduce power consumption), whilst maintaining an acceptable value for detection by modulating the current, for example by way of a low duty cycle square wave. Such a square wave would regularly produce a current pulse of sufficient magnitude to detect whether the fuse had blown whilst reducing the average current flow. The detected signal could also be frequency filtered (e.g. high pass or band pass) to increase noise immunity.

The current measurement could also be achieved using a number of methods including a current sensing resistor and associated components. Alternatively, the current measurement could comprise a current monitoring relay with an appropriate sensing range.

FIGS. 1 to 5 show and describe the GFDI circuit 14 positioned in relation to a negatively grounded circuit to be monitored. Here the dc connection that the GFDI is connected to is point 15 of the circuit to be monitored (pv array 12) at the end of (negative) grounding cable 13 that is away from the circuit to be monitored. The GFDI could be positioned in relation to a positively grounded circuit to be monitored. In this instance, the dc connection that the GFDI is connected to would be point 20 of the circuit to be monitored (for example a pv array) at the end of (positive) grounding cable 21 that is away from the circuit to be monitored as shown in FIG. 1, and would operate in the same manner with polarities adjusted as appropriate. Alternatively, the connection to the circuit to be monitored may be an intermediate point, such as a point in between two PV modules of array 12. The intermediate point may be a mid-voltage point of the array.

In an alternative embodiment, injected current 50 may comprise a signal waveform. This signal waveform may be detected after passing through the fuse by optional measurement device 54 such as a current sensing resistor which may comprise a filter. If the signal waveform is not detected by measurement device 54 then the fuse is considered to have broken. With the signal waveform embodiment, the level of current injected may be reduced when compared to the sensing current method of FIG. 5.

The input impedance of voltage monitor 47 is preferably as high as possible (for example hundreds of k ohms) to minimise power dissipation when the fuse has broken.

As can be seen, GFDI is provided with improved reliability over known mechanical systems, and with a tolerance that may be adapted to the circuit to be monitored, for example, to be tolerant of 1000v conditions. A ground fault condition may be determined using either voltage or current detection means. The individual components of the GFDI circuit may comprise pre-approved (listed) components to simplify the approvals process for standards such as UL 1741 and limit the amount of testing required.

The embodiments disclosed herein are described in relation to the monitoring of a DC circuit. The above GFDI system could also be arranged to monitor an AC circuit.

By the above embodiments, a GFDI can be provided using (listed) components that are lower rated than the maximum conditions in the circuit to be monitored.

The invention claimed is:

1. A ground fault detection circuit comprising:
   a fuse;
   a fuse detect circuit;
   the fuse and the fuse detect circuit being arranged to be coupled in parallel between a reference point and a second point of a monitored circuit for which ground faults are to be detected, wherein the fuse detect circuit comprises a voltage monitor coupled in parallel between the reference point and the second point of the monitored circuit, wherein the ground fault detection circuit further comprises a potential divider coupled between the voltage monitor and the fuse, the potential divider being directly coupled to the fuse, and wherein the fuse detect circuit is further arranged to:
   detect a fuse break indicative of a ground fault condition; and
   disable at least a portion of the monitored circuit.

2. The ground fault detection circuit of claim 1 wherein a fuse break indicative of a ground fault is detectable by detecting at least a pre-determined voltage across the fuse or a signal indicative of current passing through the fuse, and optionally wherein the pre-determined voltage across the fuse is caused by the breaking of the fuse due to at least a pre-determined current flowing therethrough.

3. The ground fault detection circuit of claim 1 wherein the fuse detect circuit comprises at least two voltage monitors arranged to be coupled in parallel between the reference point and the second point of a monitored circuit for which ground faults are to be detected.

4. The ground fault detection circuit of claim 1 wherein the potential divider comprises resistors of a value between 100 k ohms and 100 M ohms.

5. The ground fault detection circuit of claim 1 wherein the fuse is rated between 1A and 5A.

6. The ground fault detection circuit of claim 1 wherein each voltage monitor is a voltage monitoring relay.

7. The ground fault detection circuit of claim 1 wherein the fuse detect circuit is further arranged to indicate a fault condition on an output.

8. The ground fault detection circuit of claim 1 wherein the second point of the monitored circuit is a positive connection or a negative connection.

9. The ground fault detection circuit of claim 1 wherein the circuit is tolerant to voltages of 600V or more, and optionally wherein the circuit is tolerant to voltages of 1000V or more.

10. The ground fault detection circuit of claim 1 wherein the reference point is a ground connection.

11. The ground fault detection circuit of claim 1 wherein the second point is a direct current (DC) connection or an alternating current (AC) connection.

12. A method of detecting a ground fault comprising:
    detecting, by a fuse detect circuit, a break in a fuse indicative of a ground fault condition, the fuse and the fuse detect circuit arranged to be coupled in parallel between a reference point and a second point of a monitored circuit for which ground faults are to be detected; and
    disabling at least a portion of the monitored circuit in response to detecting the fuse break condition;
    wherein the fuse detect circuit comprises a voltage monitor coupled in parallel between the reference point and the second point of the monitored circuit, and wherein a potential divider is coupled between the voltage monitor and the fuse, the potential divider being directly coupled to the fuse.

13. The method of claim 12 wherein detecting a fuse break indicative of a ground fault comprises detecting at least a pre-determined voltage across the fuse or a signal indicative of current passing through the fuse, and optionally wherein the pre-determined voltage across the fuse is caused by the breaking of the fuse due to at least a pre-determined current flowing therethrough.

14. The method of claim 12 wherein the fuse detect circuit comprises at least two voltage monitors arranged to be coupled in parallel between the reference point and the second point of a monitored circuit for which ground faults are to be detected.

15. The method of claim 12 wherein the fuse detect circuit is further arranged to indicate a fault condition on an output.

16. A ground fault detection system comprising:
    the circuit of claim 1;
    wherein a photovoltaic (PV) array is the monitored circuit; and
    wherein an inverter of the PV array is arranged to be disabled in response to detecting the fuse break indicative of a ground fault condition.

* * * * *